(12) United States Patent
Busby et al.

(10) Patent No.: US 10,595,401 B1
(45) Date of Patent: Mar. 17, 2020

(54) TAMPER DETECTION AT ENCLOSURE-TO-BOARD INTERFACE

(71) Applicant: INTERNATIONAL BUSINESS MACHINES CORPORATION, Armonk, NY (US)

(72) Inventors: James A. Busby, New Paltz, NY (US); Arthur J. Higby, Cottekill, NY (US); David C. Long, Wappingers Falls, NY (US); Michael J. Fisher, Poughkeepsie, NY (US); Russell A. Budd, North Salem, NY (US); Michel Turgeon, Bromont (CA); Sylvain Tetreault, Bromont (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/424,874

(22) Filed: May 29, 2019

(51) Int. Cl.
*H05K 1/02* (2006.01)
*H05K 5/02* (2006.01)
(Continued)

(52) U.S. Cl.
CPC ............ *H05K 1/0275* (2013.01); *H05K 1/18* (2013.01); *H05K 3/0035* (2013.01); *H05K 3/06* (2013.01);
(Continued)

(58) Field of Classification Search
CPC ...... H05K 1/0275; H05K 1/18; H05K 5/0208; H05K 3/00; H05K 3/4644; H05K 2201/10151
See application file for complete search history.

(56) References Cited

U.S. PATENT DOCUMENTS 7,549,064 B2 6/2009 Elbert et al.
7,787,256 B2 8/2010 Chan et al.
(Continued)

FOREIGN PATENT DOCUMENTS

WO WO 2014/055064 A1 4/2014

OTHER PUBLICATIONS

Paley et al., "Active Protection Against PCB Physical Tampering", 2016 17th International Symposium on Quality Electronic Design (ISQED), IEEE Xplore (Mar. 2016) (6 pages).
(Continued)

*Primary Examiner* — Hoa C Nguyen
(74) *Attorney, Agent, or Firm* — Tihon Poltavets, Esq.; Kevin P. Radigan, Esq.; Heslin Rothenberg Farley & Mesiti P.C.

(57) ABSTRACT

Tamper-respondent assemblies are provided which include an enclosure assembly mounted to a circuit board and enclosing an electronic component(s) within a secure volume. The enclosure assembly includes an enclosure with an edge surface coupled to the circuit board, and a tamper-respondent sensor. The tamper-respondent sensor covers the edge surface and an inner surface of the enclosure. The sensor includes multiple layers, and at least one tamper-detect circuit. The tamper-detect circuit(s) includes a conductive trace(s) in a tamper-detect pattern covered, at least in part, by at least one layer of the multiple layers. The at least one layer is partially removed to provide exposed regions and unexposed regions of the conductive trace(s) at the edge surface of the enclosure. The conductive trace(s) is contacted where exposed by an adhesive securing the sensor to the circuit board. A monitor circuit monitors the tamper-detect circuit(s) for a tamper event.

20 Claims, 11 Drawing Sheets

(51) Int. Cl.
    *H05K 1/18*           (2006.01)
    *H05K 3/06*           (2006.01)
    *H05K 3/00*           (2006.01)
    *H05K 3/46*           (2006.01)

(52) U.S. Cl.
    CPC ......... *H05K 3/4644* (2013.01); *H05K 5/0208* (2013.01); *H05K 2201/10151* (2013.01); *H05K 2203/107* (2013.01)

(56) References Cited

U.S. PATENT DOCUMENTS

| | | | |
|---|---|---|---|
| 7,978,070 | B2 | 7/2011 | Hunter |
| 9,430,680 | B2 | 8/2016 | Obukhov |
| 9,554,477 | B1 | 1/2017 | Brodsky et al. |
| 9,661,747 | B1 | 5/2017 | Brodsky et al. |
| 9,717,154 | B2 | 7/2017 | Brodsky et al. |
| 9,999,124 | B2 | 6/2018 | Busby et al. |
| 10,078,764 | B2 | 9/2018 | Wesselhoff |
| 2006/0090918 | A1 | 5/2006 | Dangler et al. |
| 2007/0038865 | A1* | 2/2007 | Oggioni .................. G06F 21/87 713/178 |
| 2008/0036598 | A1* | 2/2008 | Oggioni .................. G06F 21/87 340/568.1 |
| 2008/0073491 | A1* | 3/2008 | Fleischman ...... G01R 31/31708 250/214 DC |
| 2010/0177487 | A1* | 7/2010 | Arshad .................. G06F 21/86 361/737 |
| 2011/0031985 | A1* | 2/2011 | Johnson .................. G06F 21/86 324/681 |
| 2011/0116242 | A1* | 5/2011 | Fabry .................. H05K 1/0275 361/748 |
| 2012/0106113 | A1* | 5/2012 | Kirmayer ............. H05K 1/0275 361/784 |
| 2012/0250271 | A1* | 10/2012 | Chen .................... H05K 5/0208 361/752 |
| 2015/0163933 | A1* | 6/2015 | Steiner ................ H05K 5/0208 174/50.51 |
| 2015/0382455 | A1* | 12/2015 | Enevoldsen ............ G06F 21/87 324/705 |
| 2016/0110567 | A1* | 4/2016 | Rooyakkers ............ G06F 21/86 726/34 |
| 2016/0188912 | A1* | 6/2016 | Neo ........................ G06F 21/87 361/749 |
| 2019/0097302 | A1* | 3/2019 | Berge ...................... H01Q 1/22 |

OTHER PUBLICATIONS

Fadden et al., "Enclosure-to-Board Interface with Tamper-Detect Circuit(s)", U.S. Appl. No. 15/901,985, filed Feb. 22, 2018 (59 pages).

Higby et al., "3-D Flex Circuit Forming", U.S. Appl. No. 16/170,005, filed Oct. 24, 2018 (25 pages).

Higby et al., "Creating a Secure Volume", U.S. Appl. No. 16/278,814, filed Feb. 19, 2019 (24 pages).

\* cited by examiner

TAMPER DETECTION AT ENCLOSURE-TO-BOARD INTERFACE

BACKGROUND

Many activities require secure electronic communications. To facilitate secure electronic communications, an encryption/decryption system can be implemented on an electronic assembly or printed circuit board assembly that is included in equipment connected to a communications network. Such an electronic assembly is an enticing target for malefactors since it can contain codes or keys to decrypt intercepted messages, or to encode fraudulent messages. To prevent this, an electronic assembly can be mounted in an enclosure, which is then wrapped in a security sensor and encapsulated with polyurethane resin. A security sensor can be, in one or more embodiments, a web or sheet of insulating material with circuit elements, such as closely-spaced, conductive traces. The circuit elements are disrupted if the sensor is torn, and the tear can be sensed in order to generate an alarm signal. The alarm signal can be conveyed to a circuit in order to reveal an attack on the integrity of the assembly. The alarm signal can also trigger an erasure of encryption/decryption keys stored within the electronic assembly.

SUMMARY

Provided herein, in one or more aspects, is a tamper-respondent assembly which includes a circuit board and an enclosure assembly mounted to the circuit board and enclosing at least one electronic component coupled to the circuit board within a secure volume. The enclosure assembly includes an enclosure with an edge surface coupled to the circuit board along an enclosure-to-board interface, and a tamper-respondent sensor. The tamper-respondent sensor covers, at least in part, an inner surface of the enclosure and extends over the edge surface of the enclosure at the enclosure-to-board interface, between the enclosure and the circuit board. The tamper-respondent sensor is secured at the enclosure-to-board interface to the circuit board via an adhesive. The tamper-respondent sensor includes multiple layers, and at least one tamper-detect circuit. The at least one tamper-detect circuit includes at least one conductive trace in a tamper-detect pattern covered, at least in part, by at least one layer of the multiple layers. The at least one layer of the multiple layers is at least partially removed to provide exposed regions and unexposed regions of the at least one conductive trace within the enclosure-to-board interface. The at least one conductive trace is contacted within the exposed regions by the adhesive securing the tamper-respondent sensor to the circuit board within the enclosure-to-board interface. The tamper-respondent assembly further includes a monitor circuit to monitor the at least one tamper-detect circuit of the tamper-respondent sensor for a tamper event.

In another aspect, a tamper-respondent assembly is provided which includes a multilayer circuit board, an enclosure assembly, and a monitor circuit. The multilayer circuit board includes an embedded tamper-detect circuit embedded, at least in part, within the multilayer circuit board. The enclosure assembly is mounted to the circuit board and encloses at least one electronic component coupled to the circuit board within a secure volume. The electronic assembly includes an enclosure with an edge surface coupled to the circuit board along an enclosure-to-board interface, and a tamper-respondent sensor. The tamper-respondent sensor covers, at least in part, an inner surface of the enclosure and extends over the edge surface of the enclosure within the enclosure-to-board interface, between the enclosure and the circuit board. The tamper-respondent sensor is secured at the enclosure-to-board interface to the circuit board via an adhesive. The tamper-respondent sensor includes multiple layers, and at least one tamper-detect circuit. The at least one tamper-detect circuit includes at least one conductive trace in a tamper-detect pattern covered, at least in part, by at least one layer of the multiple layers. The at least one layer of the multiple layers is at least partially removed to provide exposed regions and unexposed regions of the at least one conductive trace at the enclosure-to-board interface. The at least one conductive trace is contacted in the exposed regions by the adhesive securing the tamper-respondent sensor to the circuit board within the enclosure-to-board interface. The monitor circuit monitors that least one tamper-detect circuit of the tamper-respondent sensor for a tamper event.

In a further aspect, a fabrication method is presented which includes fabricating a tamper-respondent assembly. Fabricating the tamper-respondent assembly includes providing an enclosure assembly to mount to a circuit board to enclose at least one electronic component coupled to the circuit board within a secure volume. The enclosure assembly includes an enclosure within an edge surface to couple to the circuit board along an enclosure-to-board interface, and a tamper-respondent sensor. The tamper-respondent sensor covers, at least in part, an inner surface of the enclosure and extends over the edge surface of the enclosure. The tamper-respondent sensor includes multiple layers, and at least one tamper-detect circuit. The at least one tamper-detect circuit includes at least one conductive trace in a tamper-detect pattern covered, at least in part, by at least one layer of the multiple layers. Fabricating the tamper-respondent assembly further includes selectively removing the at least one layer of the multiple layers of the tamper-respondent sensor covering the at least one conductive trace at the edge surface of the enclosure to provide exposed regions and unexposed regions of the at least one conductive trace over the edge surface of the enclosure, and adhesively securing the enclosure assembly to the circuit board using an adhesive within the enclosure-to-board interface, the adhesive contacting the at least one trace within the exposed regions of the tamper-respondent sensor. Further, fabricating the tamper-respondent sensor includes providing a monitor circuit to monitor the at least one tamper-detect circuit of the tamper-respondent sensor for a tamper event.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for instance, for establishing a tamper-proof enclosure-to-board interface for a tamper-respondent assembly.

Figure 1:
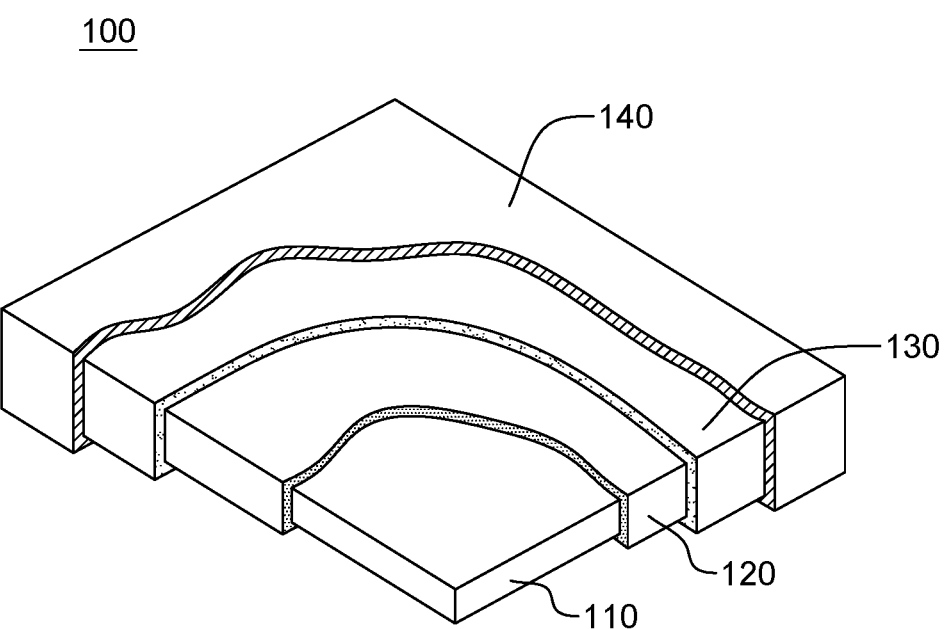
FIG. 1 is a partial cut-away of one embodiment of a tamper-proof electronic package.

Reference is first made to FIG. 1, which illustrates one approach for an electronic package 100 configured as a tamper-proof electronic package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may include security-sensitive information with, for instance, access to the information stored in the module requiring use of a variable key, and with the nature of the key being stored in the associated memory within the enclosure.

In one or more implementations, a tamper-proof electronic package or tamper-respondent assembly, such as depicted, is configured or arranged to detect attempts to tamper with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multilayer circuit board, such as a printed circuit board or other multilayer substrate, and be internally or externally powered via a power supply provided within the electronic assembly enclosure.

In the embodiment illustrated, and as one example only, electronic assembly enclosure 110 may be surrounded by a tamper-detection sensor 120, an encapsulant 130, and an outer, thermally conductive enclosure 140. In one or more implementations, tamper-detection sensor 120 may include a tamper-detection laminate that is folded around electronic assembly enclosure 110, and encapsulant 130 may be provided in the form of a molding. Tamper-detection sensor 120 may include various detection layers, which are monitored through, for instance, a ribbon cable by the enclosure monitor, against attempts to penetrate enclosure 110 and damage the enclosure monitor or erase circuit, before information can be erased from the encryption module. The tamper-detection sensor may be, for example, any such article commercially available or described in various publications and issued patents, or any enhanced article such as disclosed herein.

By way of example, tamper-detection sensor 120 may be formed as a tamper-detection laminate comprising a number of separate layers with, for instance, an outermost lamination-detection layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing conductive traces onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive material printed onto an extension of the film, if desired. Connections between the matrix and the ribbon cable may be made via connectors formed on one edge of the film. As noted, the laminate may be wrapped around the electronic assembly enclosure to define the tamper-detection sensor 120 surrounding enclosure 110.

In one or more implementations, the various elements of the laminate may be adhered together and wrapped around enclosure 110, in a similar manner to gift-wrapping a parcel, to define the tamper-detection sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-detection sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

To address the demands for ever-improving anti-intrusion technology, and the higher-performance encryption/decryption functions being provided, enhancements to a tamper-proof, tamper-evident packaging for one or more electronic components or assemblies are desired.

Numerous enhancements are described herein to, for instance, tamper-proof electronic packages or tamper-respondent assemblies. As noted, the numerous inventive aspects described herein may be used singly, or in any desired combination. Additionally, in one or more implementations, the enhancements described herein may be provided to work within defined space limitations for existing packages.

Disclosed hereinbelow with reference to FIGS. 2-10C are various approaches and/or enhancements to creating, for instance, a secure volume for accommodating one or more electronic components, such as one or more encryption and/or decryption modules and associated components of, for instance, a communications card or other electronic assembly to be protected.

Figure 2:
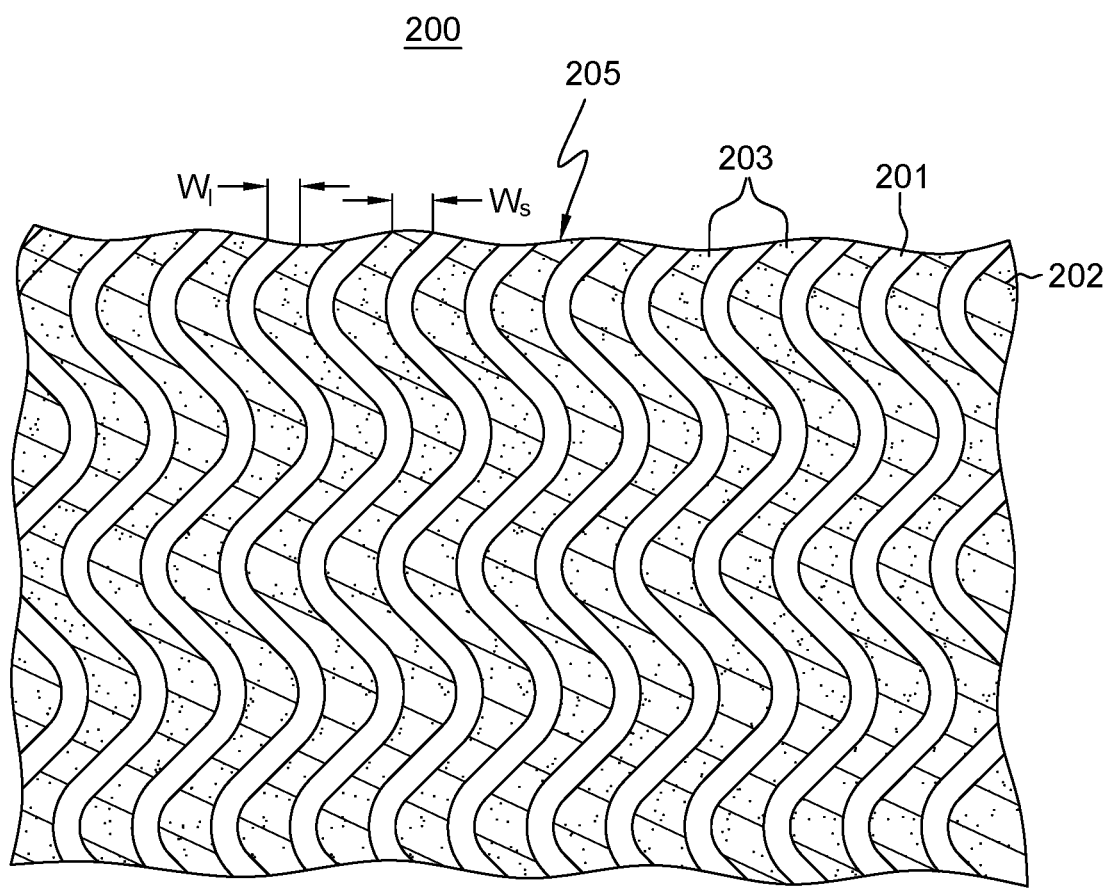
FIG. 2 depicts one embodiment of a tamper-respondent sensor with conductive traces forming, at least in part, at least one tamper-detect circuit, in accordance with one or more aspects of the present invention.

FIG. 2 depicts a portion of one embodiment of a tamper-detection layer 205 (or laser and pierce-respondent layer) of a tamper-respondent sensor 200 or security sensor, such as discussed herein. In FIG. 2, tamper-detection layer 205 includes circuit lines or conductive traces 201 provided on one or both opposite sides of a flexible layer 202, which in one or more embodiments, may be a flexible insulating layer or film. FIG. 2 illustrates conductive traces 201 on, for instance, one side of flexible layer 202, with the traces on the opposite side of the film being, for instance, the same pattern, but (in one or more embodiments) offset to lie directly below spaces 203, between conductive traces 201. As described below, the conductive traces on one side of the flexible layer can be of a line width $W_l$ and have a pitch or trace-to-trace spacing $W_s$ such that piercing of the layer 205 at any point results in damage to at least one of the conductive traces 201. In one or more implementations, the conductive traces can be electrically connected in-series or parallel to define one or more conductors which may be electrically connected in a network to an enclosure monitor, which may, in one or more implementations, monitor the resistance of the traces. Detection of an increase, or other change, in resistance, caused by cutting or damaging one of the traces, will cause information within the encryption and/or decryption module to be erased. Providing conductive traces 201 in a pattern, such as a sinusoidal pattern, may advantageously make it more difficult to breach tamper-detection layer 205 without detection. Note, in this regard, that conductive traces 201 could be provided in any desired pattern. For instance, in an alternate implementation, conductive traces 201 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, as noted, the above-summarized tamper-respondent sensor 200 of FIG. 2 can be disposed over an outer surface of an enclosure, such as an enclosure described above in connection with FIG. 1. Alternatively, as described further herein, the tamper-respondent sensor can cover or line an inner surface of an enclosure to provide a secure volume about at least one electronic component to be protected. Still further, the tamper-respondent sensor, or more particularly, the tamper-detect circuit(s) of the sensor, could be embedded within a multilayer circuit board described below.

In one or more aspects, disclosed herein is a tamper-respondent sensor 200 with conductive traces 201 having reduced line widths $W_l$ of, for instance, 200 µm, or less, such as less than or equal to 100 µm, or even more particularly, in the range of 30-70 µm. This is contrasted with conventional trace widths, which are typically on the order of 250 µm or larger. Commensurate with reducing the conductive trace width $W_l$, trace-to-trace spacing width $W_s$ 203 is also reduced to less than or equal to 200 µm, such as less than or equal to 100 µm, or for instance, in a range of 30-70 µm.

Advantageously, by reducing the trace width $W_l$ and trace-to-trace spacing $W_s$ of conductive traces 201 within tamper-respondent sensor 200, the conductive trace width and pitch is on the same order of magnitude as the smallest intrusion instruments currently available, and therefore, any intrusion attempt will necessarily remove a sufficient amount of a conductive trace(s) to cause resistance to change, and thereby the tamper intrusion to be detected. Note that, by making the conductive trace width of the smaller dimensions disclosed herein, any cutting or damage to the smaller-dimensioned conductive trace will also be more likely to be detected, that is, due to a greater change in resistance. For instance, if an intrusion attempt cuts a 100 μm width line, it is more likely to reduce the line width sufficiently to detect the intrusion by a change in resistance. A change in a narrower trace width is more likely to result in a detectable change in resistance, compared with, for instance, a 50% reduction in a more conventional trace width of 350 μm to, for instance, 175 μm. The smaller the conductive trace width becomes, the more likely that a tampering of that line will be detected.

Note also that a variety of materials may advantageously be employed to form the conductive traces when implemented using resistance monitoring. For instance, the conductive traces may be formed of a conductive ink (such as a carbon-loaded conductive ink) printed onto one or both opposite sides of one or more of the flexible layers 202 in a stack of such layers. Alternatively, a metal or metal alloy could be used to form the conductive traces, such as copper, silver, intrinsically conductive polymers, carbon ink, or nickel-phosphorus (NiP), such as Omega-Ply®, offered by Omega Technologies, Inc. of Culver City, Calif. (USA), or nickel-chrome, such as Ticer™ offered by Ticer Technologies, Chandler, Ariz. (USA). Note that the process employed to form the fine conductive traces or traces on the order described herein is dependent, in part, on the choice of material used for the conductive traces. For instance, if copper conductive traces are being fabricated, then additive processing, such as plating up copper traces, or subtractive processing, such as etching away unwanted copper between trace lines, may be employed. By way of further example, if conductive ink is employed as the conductive trace material, fine conductive traces on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 μm), and a squeegee angle may be used such that the ink is sheared to achieve conductive ink breakaway rather than pumping the conductive ink through the screen apertures. Note that the screen for fine trace width printing such as described herein can have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In a further aspect, the flexible layer 202 itself can be further reduced in thickness from a typical polyester layer by selecting a crystalline polymer to form the flexible layer or substrate. By way of example, the crystalline polymer could include polyvinylidene difluoride (PVDF), or Kapton, or other crystalline polymer material. Advantageously, use of a crystalline polymer as the substrate film can reduce thickness of the flexible layer 202 to, for instance, 2 mils thick from a more conventional amorphous polyester layer of, for instance, 5-6 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-detection layer stack, the stack thickness can be reduced from, for instance, 20 mils in the case of a typical polyester film, to 10 mils or less with the use of crystalline polymer films.

Figure 3A:
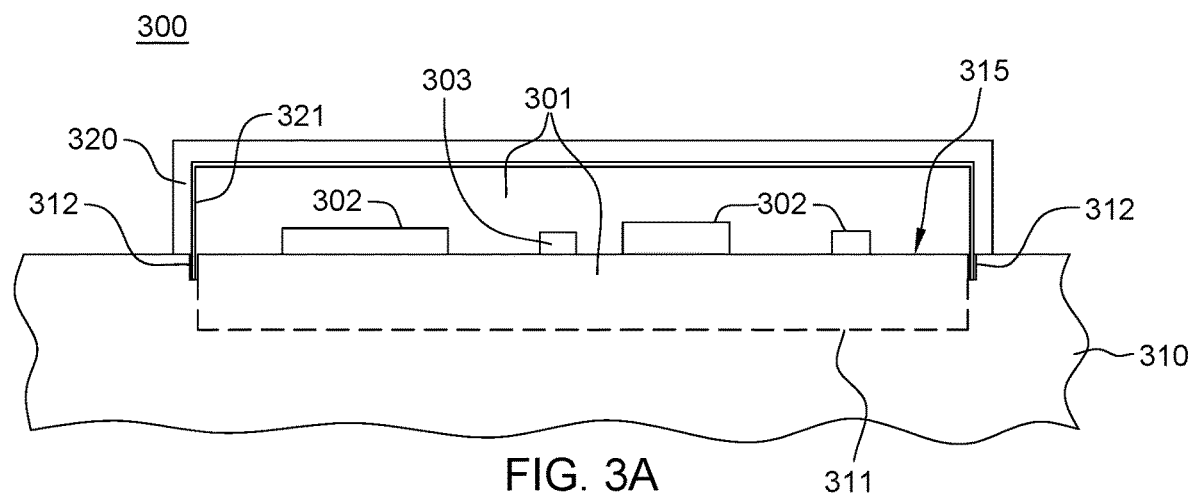
FIG. 3A is a cross-sectional elevational view of another embodiment of a tamper-proof electronic package, or tamper-respondent assembly, which includes (in part) an enclosure, and a multilayer circuit board with an embedded tamper-detect circuit, in accordance with one or more aspects of the present invention.
Figure 3B:
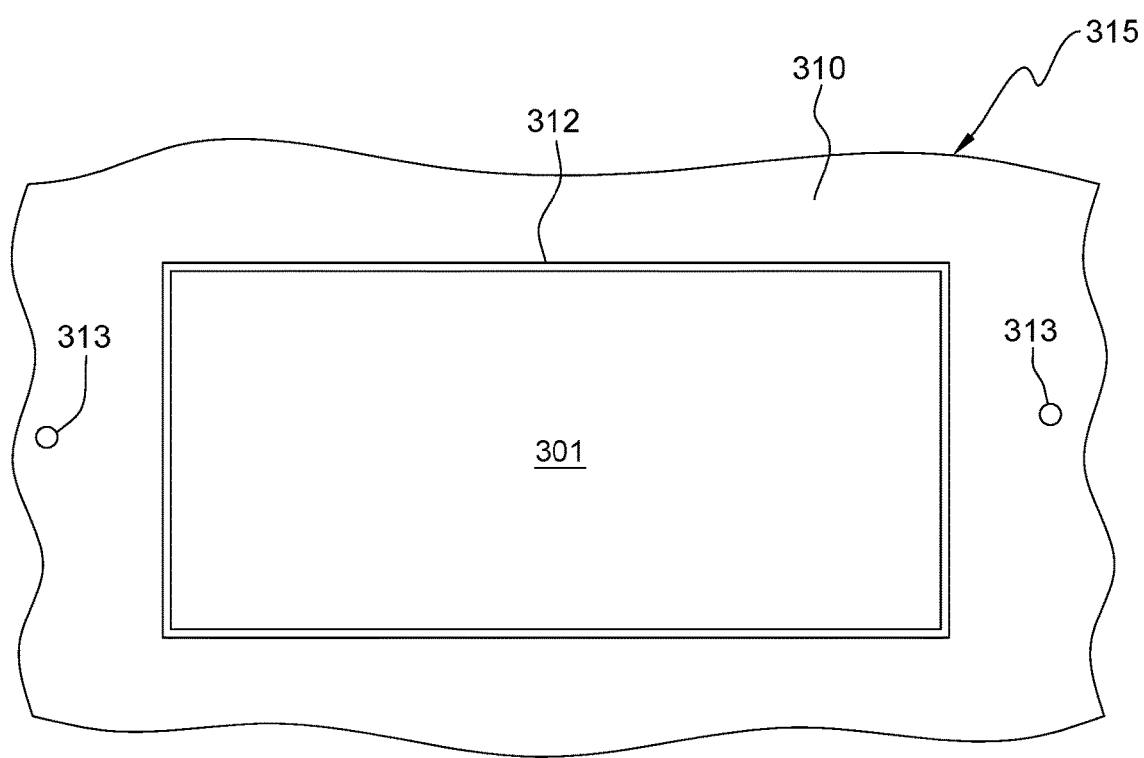
FIG. 3B is a top plan view of the multilayer circuit board of FIG. 3A, depicting one embodiment of the secure volume defined, in part, within the multilayer circuit board, in accordance with one or more aspects of the present invention.

FIGS. 3A & 3B depict one embodiment of a tamper-proof electronic package 300, or tamper-respondent assembly, which includes one or more electronic components, such as a circuit 315 and/or electronic devices (or elements) 302 to be protected, in accordance with one or more further aspects of the present invention.

Referring collectively to FIGS. 3A & 3B, circuit 315 resides on or is embedded within a multilayer circuit board 310, which also has an embedded tamper-respondent sensor 311 that facilitates defining, in part, a secure volume 301 associated with multilayer circuit board 310 that (in one or more embodiments) extends into multilayer circuit board 310. In particular, in the embodiment of FIGS. 3A & 3B, secure volume 301 can exist partially within multilayer circuit board 310, and partially above multilayer circuit board 310. One or more electronic devices 302 are mounted to multilayer circuit board 310 within secure volume 301 and can include, for instance, one or more encryption modules and/or decryption modules, and/or associated components, to be protected within the tamper-proof electronic package. In one or more implementations, the one or more electronic components to be protected can include, for instance, a secure communications card of a computer system.

Tamper-proof electronic package 300 further includes an enclosure 320, such as a pedestal-type enclosure, mounted to multilayer circuit board 310 adjacent to, for instance, a continuous groove (or trench) 312 formed within an upper surface of multilayer circuit board 310, and can be secured to the multilayer circuit board 310 via, for instance, a structural adhesive. In one or more embodiments, enclosure 320 can include a thermally conductive material and operate as a heat sink for facilitating cooling of the one or more electronic components 302 within the secure volume. A security mesh or tamper-respondent sensor 321 can be associated with enclosure 320, for example, wrapping around the inner surface of enclosure 320, to facilitate defining, in combination with tamper-respondent sensor 311 embedded within multilayer circuit board 310, secure volume 301. In one or more implementations, tamper-respondent sensor 321 extends down into continuous groove 312 in multilayer circuit board 310. In one or more implementations, enclosure 320 can be securely affixed to multilayer circuit board 310 using, for instance, a bonding material such as an epoxy or other adhesive.

As noted above in connection with FIG. 2, tamper-respondent sensor 321 can include, in one or more examples, one or more tamper-detection layers which include conductive traces provided on one or both sides of a flexible layer, which in one or more implementations, can be a flexible insulating layer or film. The conductive traces on one or both sides of the flexible layer can be of a line width and have a pitch or trace-to-trace spacing such that piercing of the layer at any point results in damage to one or more of the conductive traces. In one or more implementations, the conductive traces can define one or more conductors which can be electrically connected in a network to an enclosure monitor or detector 303, which monitors, for instance, resistance on the traces, or in the case of conductors, can monitor for a nonlinearity, or non-linear conductivity change, on the conductive lines. Detection of a change in resistance or a nonlinearity caused by cutting or damaging one or more of the lines, will cause information within the secure volume to be automatically erased. The conductive lines of the tamper-respondent sensor can be in any desired pattern, such as a sinusoidal pattern, to make it more difficult to breach the tamper-detection layer without detection.

For resistive monitoring, a variety of materials can be employed to form the conductive traces. For instance, the conductive traces may be formed of a metal or metal alloy, such as copper, or silver, or could be formed, for example, of an intrinsically-conductive polymer, carbon ink, or nickel phosphorous (NiP), or Omegaply®, offered by Omega Technologies, Inc., of Culver City, Calif. (USA), or Ticer™, offered by Ticer Technologies, Chandler, Ariz. (USA). The process employed to form the fine conductive traces is dependent, in part, on the choice of materials used for the conductive traces. For instance, if copper conductive traces are fabricated, then additive processing, such as plating of copper traces, or subtractive processing, such as etching away unwanted copper between traces, may be employed.

As noted, in one or more implementations, the conductive traces of the tamper-respondent sensor(s) lining the inner surface(s) of enclosure 320, or even printed directly onto one or more layers formed over the inner surface of enclosure 320, can be connected to define one or more detect networks.

If a flexible layer is used over the inner surface of enclosure 320, then the flexible layer can be formed of a crystalline polymer material. For instance, the crystalline polymer could include polyvinylidene difluoride (PVDF), or Kapton, or other crystalline polymer material. Advantageously, a crystalline polymer can be made much thinner, while still maintaining structural integrity of the flexible substrate, which also allows for enhanced folding, and greater reliability of the sensor after folding.

As depicted in FIG. 3B, one or more external circuit connection vias 313 can be provided within multilayer circuit board 310 for electrically connecting to the one or more electronic components within secure volume 301. These one or more external circuit connection vias 313 can electrically connect to one or more external signal lines or planes (not shown) embedded within multilayer circuit board 310 and extending, for instance, into a secure base region of (or below) secure volume 301, as explained further below. Electrical connections to and from secure volume 301 can be provided by coupling to such external signal lines or planes within the multilayer circuit board 310.

As noted, secure volume 301 can be sized to house one or more electronic components to be protected, and can be constructed to extend into multilayer circuit board 310. In one or more implementations, multilayer circuit board 310 includes electrical interconnect within the secure volume 301 defined in the board, for instance, for electrically connecting one or more tamper-detection layers of the embedded tamper-respondent sensor 311 to associated monitor circuitry also disposed within secure volume 301, along with, for instance, one or more daughter cards, such as memory DIMMs, PCIe cards, processor cards, etc.

Note that the packaging embodiment depicted in FIGS. 3A & 3B is presented by way of example only. Other configurations of enclosure 320, or multilayer circuit board 310 can be employed, and/or other approaches to coupling enclosure 320 and multilayer circuit board 310 can be used.

Figure 4:
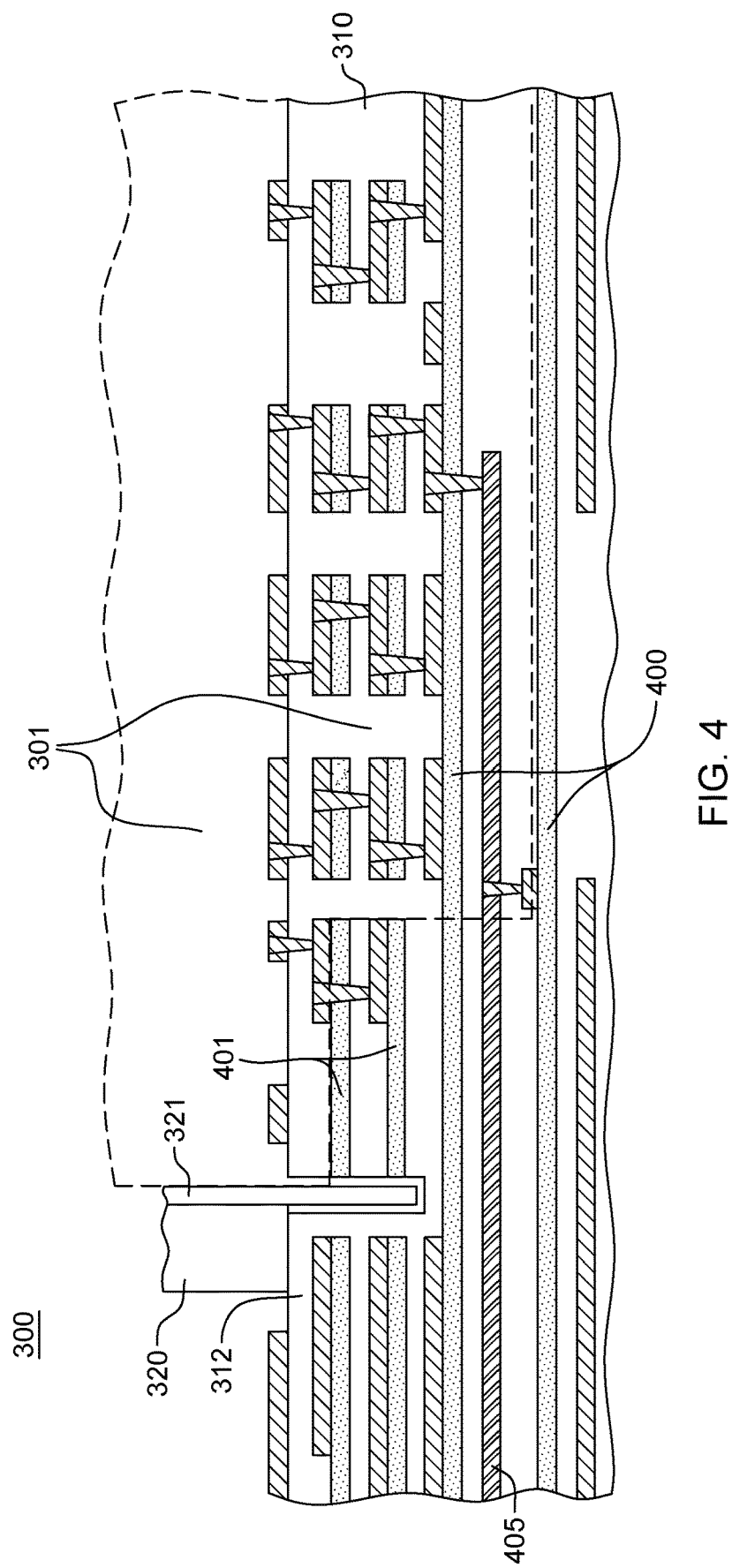
FIG. 4 is a partial cross-sectional elevational view of a more detailed embodiment of the tamper-respondent assembly of FIGS. 3A & 3B including (in part) an enclosure and a multilayer circuit board with embedded tamper-detect circuit, in accordance with one or more aspects of the present invention.

By way of further example, FIG. 4 depicts a partial cross-sectional elevational view of a more detailed embodiment of tamper-proof electronic package 300, and in particular, of multilayer circuit board 310, to which enclosure 320 is secured. In this configuration, the embedded tamper-respondent sensor includes multiple tamper-detection layers including, by way of example, at least one tamper-detection mat (or base) layer 400, and at least one tamper-detection frame 401. In the example depicted, two tamper-detection mat layers 400 and two tamper-detection frames 401 are illustrated, by way of example only. The lower-most tamper-detection mat layer 400 can be a continuous sense or detect layer extending completely below the secure volume being defined within and/or above multilayer circuit board 310. One or both tamper-detection mat layers 400 below secure volume 301 can be partitioned into multiple circuit zones. Within each tamper-detection mat layer, or more particularly, within each circuit zone of each tamper-detection mat layer, multiple circuits or conductive traces can be provided in any desired configuration.

As illustrated, one or more external signal lines or planes 405 can enter secure volume 301 between, in one embodiment, two tamper-detection mat layers 400, and then electrically connect upwards into the secure volume 301 through one or more conductive vias, arranged in any desired location and pattern. In the configuration depicted, the one or more tamper-detection frames 401 are disposed at least inside of the area defined by continuous groove 312 accommodating the base of enclosure 320. Together with the tamper-respondent sensor(s) 321 associated with enclosure 320, tamper-detection frames 401, and tamper-detection mat layers 400, define secure volume 301, which can extend, in part, into multilayer circuit board 310. With secure volume 301 defined, in part, within multilayer circuit board 310, the external signal line(s) 405 can be securely electrically connected to, for instance, the one or more electronic components mounted to, or of, multilayer circuit board 310 within secure volume 301. In addition, secure volume 301 can accommodate electrical interconnection of the conductive traces of the multiple tamper-detection layers 400, 401, for instance, via appropriate monitor circuitry.

Added security can be provided by extending tamper-detection mat layers 400 (and if desired, tamper-detection frames 401) outward past the periphery of enclosure 320. In this manner, a line of attack can be made more difficult at the interface between enclosure 320 and multilayer circuit board 310 since the attack would need to clear, for instance, tamper-detection mat layers 400, the enclosure 320, as well as the tamper-detection frames 401 of the embedded tamper-detect circuit.

Numerous variations on multilayer circuit board 310 of FIGS. 3A-4 are possible. For instance, in one embodiment, the embedded tamper-detect circuit can include one or more tamper-detection mat layers 400 and one or more tamper-detection frames 401, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, would be facilitated.

Note also that, once the secure volume is defined in part within multilayer circuit board 310, conductive vias within the secure volume between layers of multilayer circuit board 310 can be either aligned, or offset, as desired, dependent upon the implementation. Alignment of conductive vias can facilitate, for instance, providing a shortest connection path, while offsetting conductive vias between layers can further enhance security of the tamper-proof electronic package by making an attack into the secure volume through or around one or more tamper-detection layers of the multiple tamper-detection layers more difficult.

The tamper-detection layers of the embedded tamper-detect circuit formed within the multilayer circuit board of the electronic circuit or electronic package can include multiple conductive traces or lines formed between, for instance, respective sets of input and output contacts or vias at the trace termination points. Any pattern and any number of conductive traces or circuits may be employed in defining a tamper-detection layer or a tamper-detection circuit zone within a tamper-detection layer. For instance, 4, 6, 8, etc., conductive traces can be formed in parallel (or otherwise) within a given tamper-detection layer or circuit zone between the respective sets of input and output contacts to those conductive traces.

Figure 5:
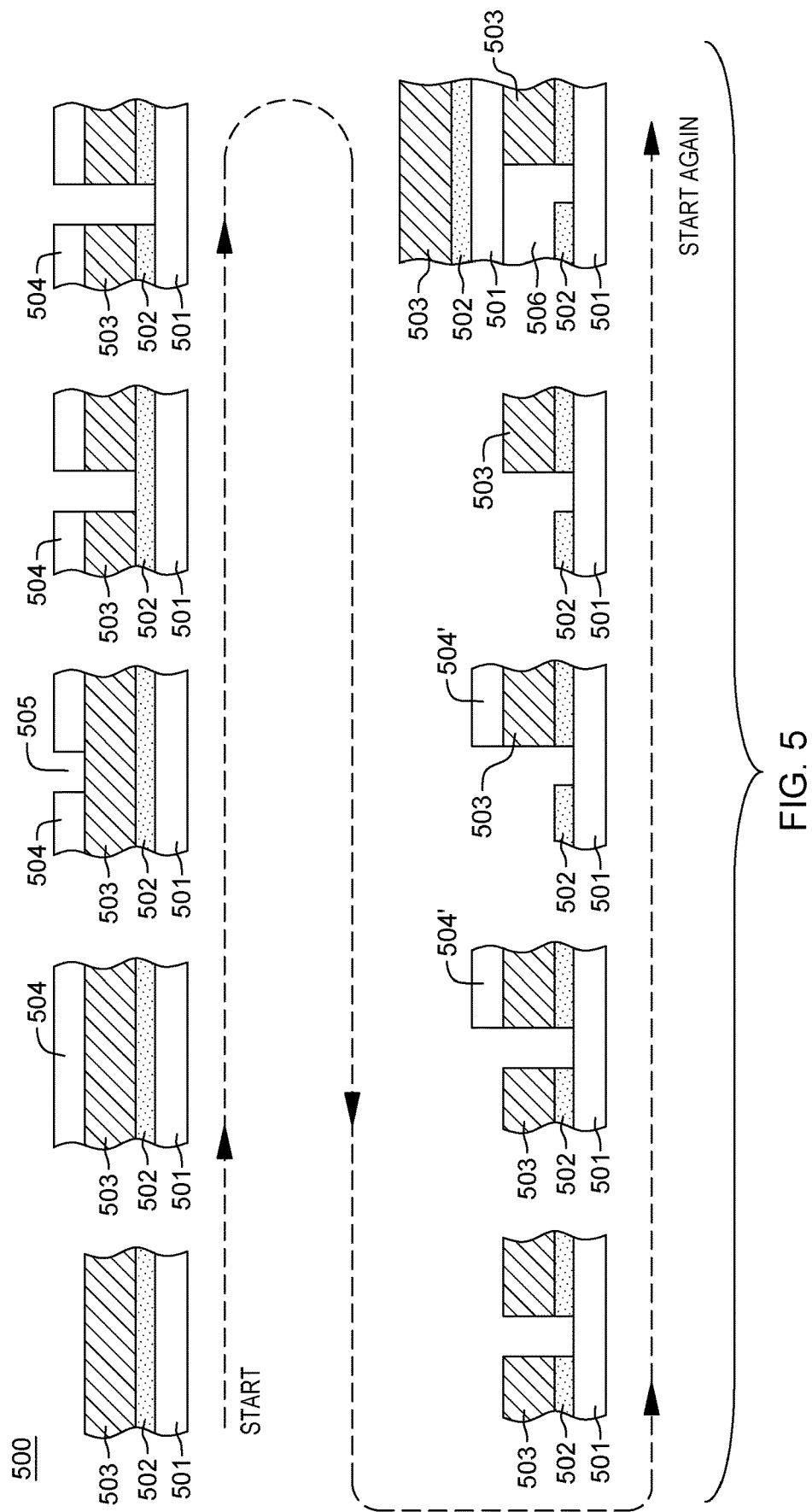
FIG. 5 depicts one embodiment of a process of fabricating a multilayer circuit board with an embedded tamper-detect circuit, in accordance with one or more aspects of the present invention.

In one or more implementations, the multilayer circuit board can be a multilayer wiring board or printed circuit board formed, for instance, by building up the multiple layers of the board. FIG. 5 illustrates one embodiment for forming and patterning a tamper-detection layer within such a multilayer circuit board.

As illustrated in FIG. 5, in one or more implementations, a tamper-detection layer, such as a tamper-detection mat layer or a tamper-detection frame disclosed herein, can be formed by providing a material stack including, at least in part, a structural layer 501, such as a pre-preg (or pre-impregnated) material layer, a trace material layer 502 for use in defining the desired trace patterns, and an overlying conductive material layer 503, to be patterned to define conductive contacts or vias electrically connecting to the pattern of traces being formed within the trace material layer 502, for instance, at trace terminal points. In one or more implementations, the trace material layer 502 can include nickel phosphorous (NiP), and the overlying conductive layer 503 can include copper. Note that these materials are identified by way of example only, and that other trace and/or conductive materials may be used within the build-up 500.

A first photoresist 504 is provided over build-up 500, and patterned with one or more openings 505, through which the overlying conductive layer 503 may be etched. Depending on the materials employed, and the etch processes used, a second etch process can be desired to remove portions of trace material layer 502 to define the conductive traces of the subject tamper-detection layer. First photoresist 504 can then be removed, and a second photoresist 504' is provided over the conductive layer 503 features to remain, such as the input and output contacts. Exposed portions of conductive layer 503 are then etched, and the second photoresist 504' can be removed, with any opening in the layer being filled, for instance, with an adhesive (or pre-preg) 506 and a next build-up layer is provided, as shown. Note that in this implementation, most of overlying conductive layer 503 is etched away, with only the conductive contacts or vias remaining where desired, for instance, at the terminal points of the traces formed within the layer by the patterning of the trace material layer 502. Note that any of a variety of materials can be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

The trace lines or circuits within the tamper-detection layers, and in particular, the tamper-detection circuit zones, of the embedded tamper-detect circuit, along with the tamper detector monitoring the enclosure, can be electrically connected to monitor or compare circuitry provided, for instance, within secure volume 301 (FIG. 3A) of the tamper-proof electronic package. The monitor circuitry can include various bridges or compare circuits, and conventional printed wiring board electrical interconnect inside secure volume 301 (FIG. 3A), for instance, located within the secure volume defined by the tamper-detection frames 401 (FIG. 4), and the tamper-detection mat layers 400 (FIG. 4).

Note that advantageously, different tamper-detection circuit zones on different tamper-detection layers can be electrically interconnected into, for instance, the same detect circuitry. Thus, any of a large number of interconnect configurations may be possible. For instance, if each of two tamper-detection mat layers contains 30 tamper-detection circuit zones, and each of two tamper-detection frames contains 4 tamper-detection circuit zones, then, for instance, the resultant 68 tamper-detection circuit zones can be connected in any configuration within the secure volume to create the desired arrangement of circuit networks within the secure volume being monitored for changes in resistance or tampering. Note in this regard, that the power supply or battery for the tamper-respondent sensor(s) can be located internal or external to the secure volume, with the sensor being configured to trip and destroy any protected or critical data if the power supply or battery is tampered with.

Figure 6:
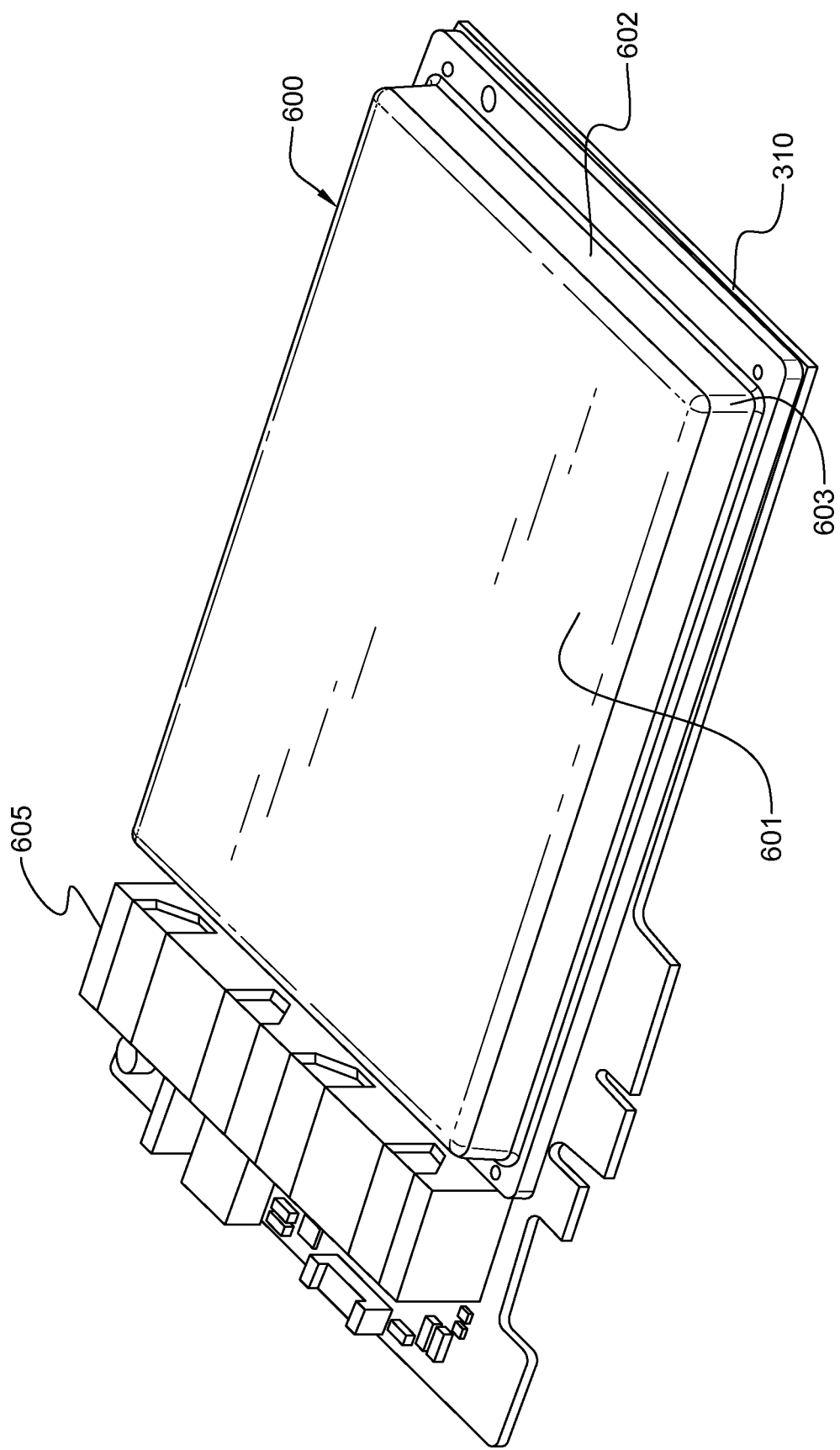
FIG. 6 is an isometric view of one embodiment of a tamper-respondent assembly, in accordance with one or more aspects of the present invention.

By way of further example, an isometric view of one embodiment of a tamper-proof electronic package is depicted in FIG. 6, wherein an enclosure 600 (such as enclosure 320 of FIG. 3A) is shown sealed to multilayer circuit board 310 to define a secure volume about one or more electronic components, as described herein. In the embodiment depicted, enclosure 600 can be formed of a thermally conductive material, and includes a main surface 601 and sidewall(s) 602 which include sidewall corners 603. An inner surface of enclosure 600 would include an inner main surface, and an inner sidewall surface corresponding to main surface 601 and sidewall(s) 602 respectively, with the inner main surface and inner sidewall surfaces being covered, at least in part, by one or more tamper-respondent sensors, such as described above. A power supply 605 or battery for the tamper-respondent sensor can be located, as depicted in this embodiment, external to the secure volume, with the tamper detector being configured to trip and destroy any protected or critical data if the power supply or battery is tampered with. Enclosure 600 can be adhered to multilayer circuit board 310, which as noted herein, can include its own tamper protection.

Figure 7:
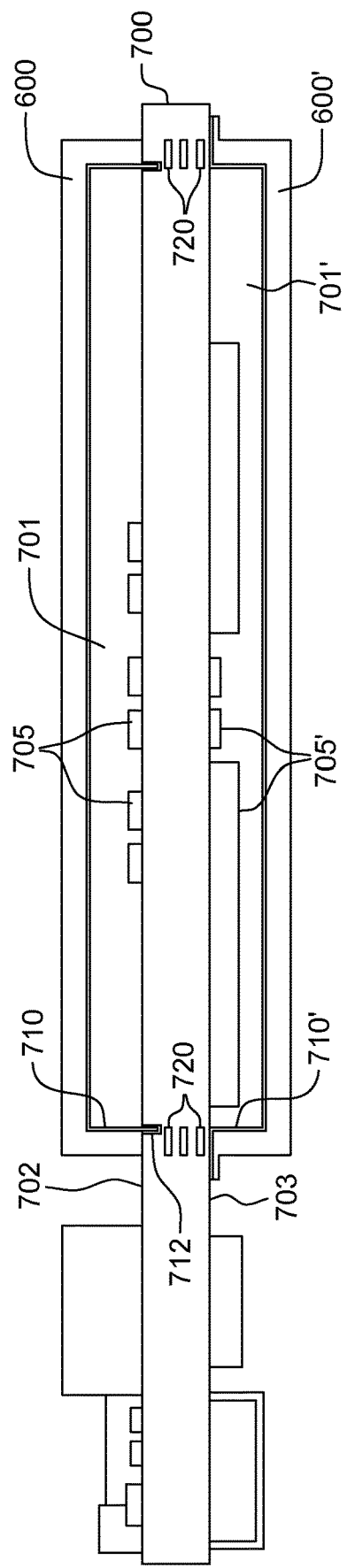
FIG. 7 is a cross-sectional elevational view of a further embodiment of a tamper-proof electronic package, or tamper-respondent assembly, which includes (in part) a first enclosure assembly mounted to one side of a circuit board, and a second enclosure assembly mounted to a second side of the circuit board, in accordance with one or more aspects of the present invention.

FIG. 7 depicts a further embodiment of a tamper-proof electronic package, or tamper-respondent assembly, which includes one or more electronic components 705, 705' to be protected, in accordance with one or more aspects of the present invention. As illustrated, electronic components 705, 705' reside on a first side 702 and a second side 703, respectively, of circuit board 700, which are opposite sides of circuit board 700. The electronic components 705, 705' are enclosed in respective secure volumes 701, 701' via respective enclosures 600, 600', each of which includes one or more tamper-respondent sensors 710, 710' on inner surfaces thereof, such as described herein.

More particularly, tamper-respondent sensor 710, 710' can be, in one or more embodiments, similar to the tamper-respondent sensors described above in connection with FIGS. 2-3A. By way of example only, tamper-respondent sensor 710 is shown to extend into a groove 712 in first side 702 of circuit board 700, similar to the tamper-respondent assembly embodiment of FIG. 3A, while tamper-respondent sensor 710', covering, at least in part, an inner surface of enclosure 600', extends over the edge surface of enclosure 600' at the enclosure-to-board interface between the enclosure and the circuit board, that is, where enclosure 600' is coupled to circuit board 700. Other variations are also possible. For instance, the enclosure assembly which includes enclosure 600 and tamper-respondent sensor 710 could be configured to flush-mount to first side 702 in a manner similar to the enclosure assembly on the other side of circuit board 700. In particular, enclosure 600 could be similarly configured as enclosure 600' to flush-mount to first side 702 of circuit board 700, and tamper-respondent sensor 710 could be similarly configured as tamper-respondent sensor 710' to cover, at least in part, the inner surface of the enclosure 600, and extend over the edge surface of the enclosure at the enclosure-to-board interface between the enclosure and the circuit board at first side 702. Thus, in one or more embodiments, the enclosure assembly-to-board interface at first side 702 could be similar or identical to the interface at second side 703. An appropriate structural adhesive can be used to couple the enclosure assemblies to the respective sides of circuit board 700, and in particular, to couple the tamper-respondent sensor 710' to second side 703 of circuit board 700, in the embodiment illustrated in FIG. 7.

In this embodiment, circuit board 700 can be a multilayer circuit board, such as multilayer circuit board 310 (FIGS. 3A-5) discussed above, or can be of different construction. By way of further example, circuit board 700 can be provided with one or more lines of conductive vias 720 arranged around the perimeter of the secure volume 701, 701' as a protective picket-fence-type, embedded tamper-detect circuit(s) within the board, which can be, for instance, aligned between the respective enclosures 600, 600' where contacting circuit board 700, as illustrated. In one example, circuit board 700 can be a card, such as a communications card, which resides within a larger electronic assembly.

Note that the further embodiment of FIG. 7 is provided by way of example only. In one or more other implementations, a single enclosure can flush-mount to a side of circuit board 700, or each enclosure 600, 600' can flush-mount to a respective side of circuit board 700, or even to a common side, with each flush-mount defining a respective enclosure-to-board interface. Note that in a flush-mount configuration, the enclosure assembly mounts directly to a surface of a circuit board, without the use of one or more trenches to accommodate the tamper-respondent sensor, such as tamper-respondent sensor 710 in the example of FIG. 7. Further, note that in one or more embodiments disclosed herein, that the enclosures can each be a solid structure without any openings. For instance, the enclosures can be pedestal-type or five-sided enclosures or cans, which substantially completely seal and form the secure volume(s), such as secure volume 701, 701' when the respective enclosure is mounted to the circuit board 700.

FIGS. 8A-10C depict further details of enhanced embodiments of a tamper-respondent assembly, in accordance with one or more aspects of the present invention. In these tamper-respondent assemblies, an enclosure and tamper-respondent sensor such as discussed herein define an enclosure assembly that is to be mounted to a circuit board, such as circuit board 700 of FIG. 7, to enclose one or more electronic components coupled to the circuit board within a secure volume.

Figure 8A:
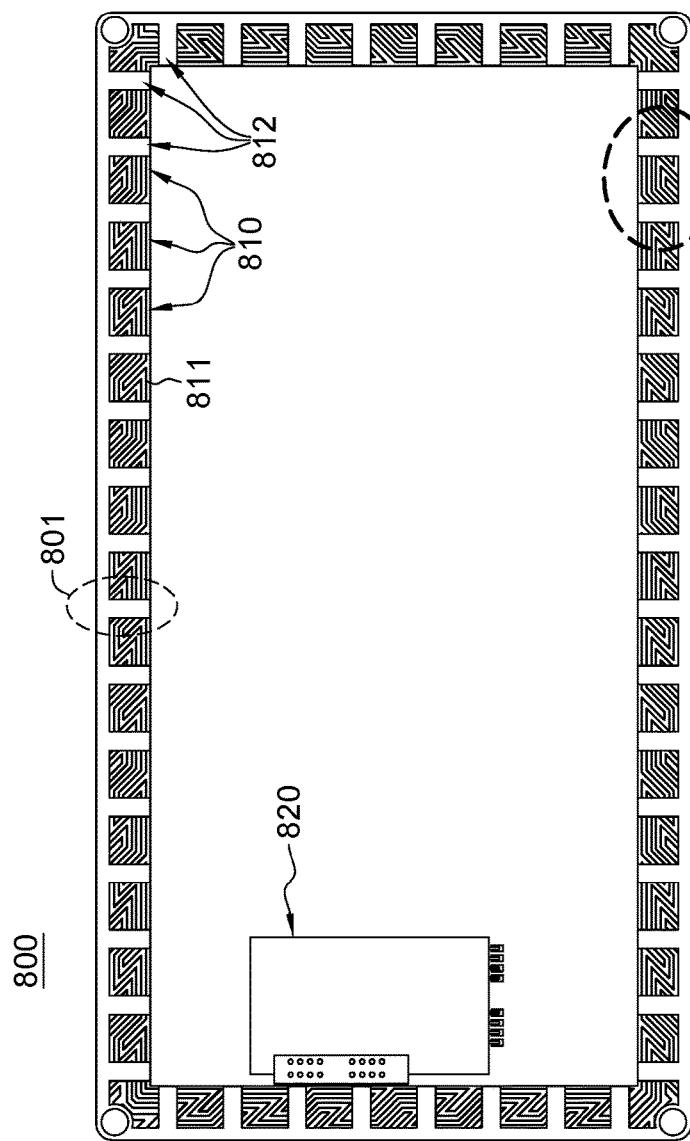
FIG. 8A is a plan view of one embodiment of an enclosure assembly with at least one partially exposed conductive trace of the tamper-respondent sensor at an edge surface of the enclosure, in accordance with one or more aspects of the present invention.

As depicted in FIG. 8A, an enclosure assembly 800 includes an enclosure, such as enclosure 600, 600' of FIGS. 6 & 7, with an edge surface 801 to couple to a circuit board, such as circuit board 700 of FIG. 7, along an enclosure-to-board interface. Further, a tamper-respondent sensor, such as tamper-respondent sensor 200, 321, 710, 710' in the embodiments discussed above in connection with FIGS. 2, 3A, 6 & 7, covers, at least in part, an inner surface of the enclosure, and extends over edge surface 801 of the enclosure at the enclosure-to-board bond interface. The tamper-respondent sensor can be, in one or more embodiments, adhesively secured to the enclosure, and adhesively secured with the same or a different adhesive, within the enclosure-to-board interface to the circuit board, such as depicted in FIGS. 3A, 6 & 7.

The tamper-respondent sensor includes, in one or more embodiments, multiple layers, such as multiple flexible layers as described herein, as well as one or more tamper-detect circuits. The tamper-detect circuit(s) includes at least one conductive trace in a tamper-detect pattern covered, at least in part, by at least one layer of the multiple layers. In particular, at least one outer layer of the tamper-detect circuit covers and provides protection to the conductive trace(s) disposed within the tamper-respondent sensor.

Figure 8B:
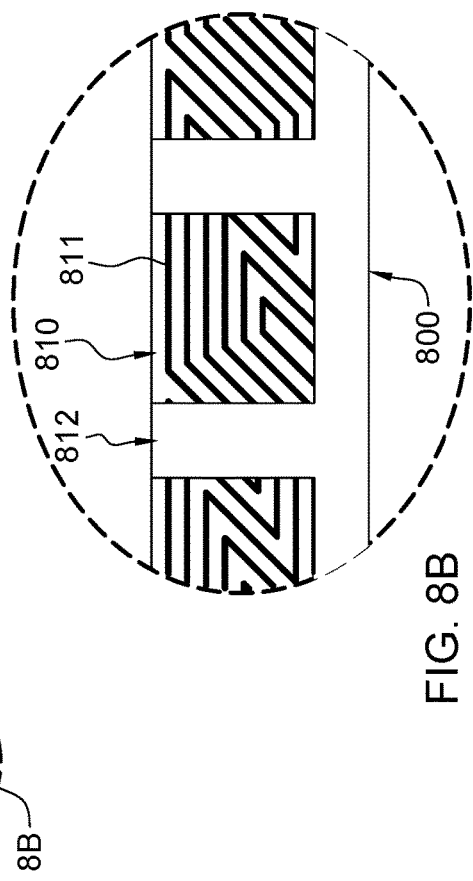
FIG. 8B is a partially enlarged depiction of the assembly of FIG. 8A, in accordance with one or more aspects of the present invention.

As illustrated in FIGS. 8A & 8B, regions of the at least one layer over the conductive trace(s) are removed over the edge surface of the enclosure to define exposed regions 810 and unexposed regions 812 of the at least one conductive trace 811. In this manner, the conductive trace(s) 811 in exposed regions 810 is directly contacted during fabrication by the adhesive used to secure the enclosure assembly to the circuit board along the enclosure-to-board bond interface. Further, a monitor circuit 820 can also be provided to monitor the at least one tamper-detect circuit of the tamper-respondent sensor for a tamper event, as described herein. Advantageously, by the adhesive directly contacting conductive trace(s) 811 in the exposed regions 810 of the conductive trace(s) 811, an increased susceptibility of the conductive trace to breaking with a tamper event at the interface is established. In particular, by directly contacting the adhesive to the conductive trace(s), an attempt to mechanically tamper with the adhesive, to facilitate gaining access to the secure volume within the tamper-respondent assembly, is more likely to damage the one or more conductive traces, and thus be detected. In this manner, the exposed conductive trace(s) provides increased fragility or susceptibility to a tamper event at the enclosure-to-board bond interface. As described below, in one or more embodiments, laser ablation is used to selectively ablate the one or more layers of the tamper-respondent sensor over the conductive trace(s) of the tamper-detect circuit at the edge surface of the enclosure, in order to allow the adhesive to directly contact the conductive trace(s) at the bond interface.

Note that the configuration of exposed and unexposed regions of FIGS. 8A & 8B is presented by way of example only. In the example of FIG. 8A, the exposed regions 810 and unexposed regions 812 alternate over edge surface 801 of the enclosure along the enclosure-to-board interface (or bond region) for the enclosure assembly to the circuit board. Further, as illustrated, the exposed regions 810 and unexposed regions 812 can alternate in a repeating pattern along the enclosure-to-board interface, if desired, for a particular implementation.

Figure 9A:
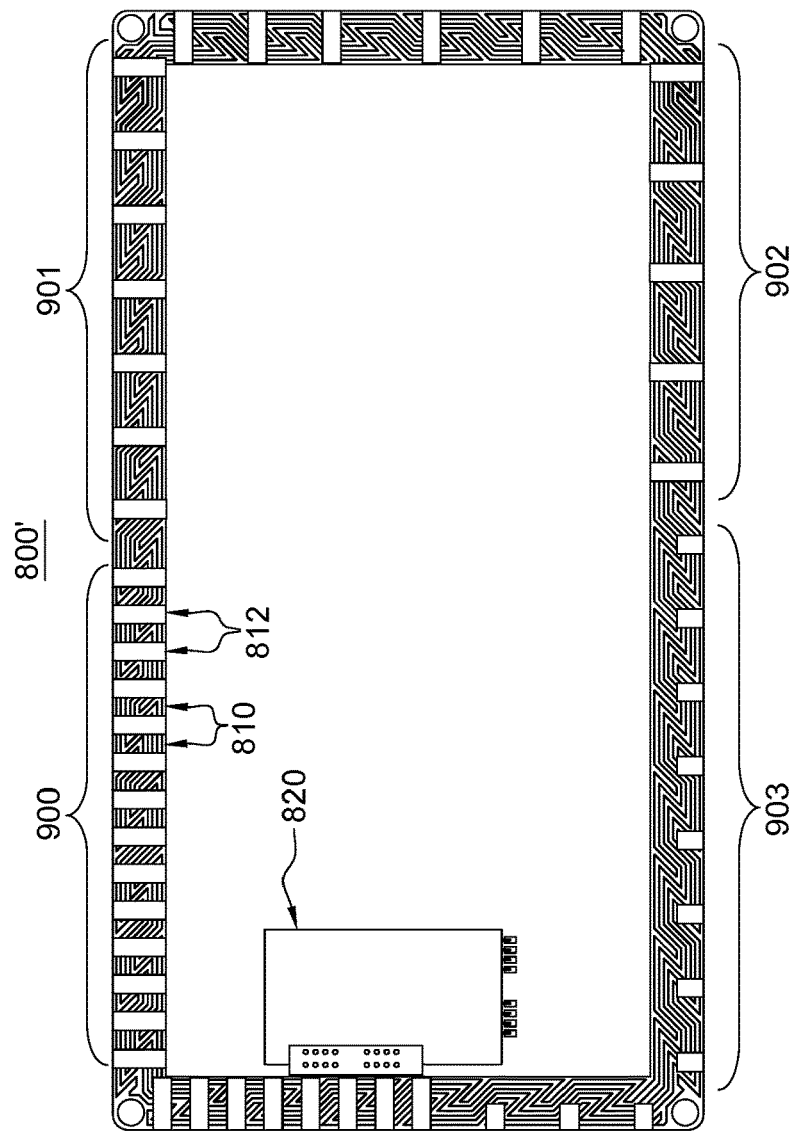
FIG. 9A is a plan view of a further embodiment of an enclosure assembly with at least one partially exposed conductive trace of the tamper-respondent sensor at an edge surface of the enclosure, in accordance with one or more aspects of the present invention.

FIG. 9A depicts a further embodiment of an enclosure assembly 800', where the exposed regions 810 and unexposed regions 812 alternate in different patterns in different regions 900, 901, 902 & 903 around the edge surface of the enclosure assembly. For instance, and by way of example only, in region 900, exposed and unexposed regions 810, 812 alternate in a 1×1 mm spacing pattern, in region 901, exposed and unexposed regions 810, 812, alternate in a 1×3 mm pattern, and in region 902, the exposed and unexposed regions 810, 812 alternate in a 1×5 mm pattern. Note further in this example that, in region 903, the unexposed regions 812 are formed as peninsulas not extending fully across the width of the enclosure-to-board interface or edge surface. In one or more implementations, the unexposed regions 812 function as set-offs between the enclosure assembly and circuit board to protect the one or more conductive traces. Further, note that the configuration of the exposed and unexposed regions can vary, depending on the implementation.

Figure 9B:
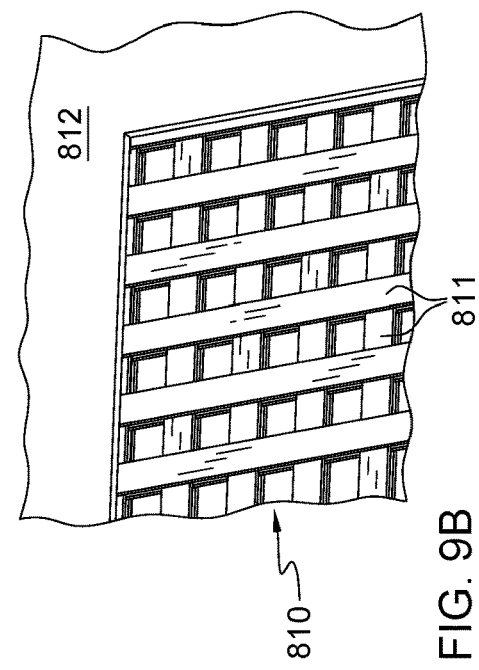
FIG. 9B is a partial view of another embodiment of an enclosure assembly, depicting multiple layers of the tamper-respondent sensor removed to expose multiple layers of conductive traces of the tamper-respondent sensor, in accordance with one or more aspects of the present invention.

FIG. 9B depicts another variation of a tamper-respondent assembly with one or more exposed and unexposed regions over an edge surface of an enclosure to be secured to a circuit board at an enclosure-to-board bond interface, as described herein. In the embodiment illustrated in FIG. 9B, multiple layers of the tamper-respondent assembly over the edge surface of the enclosure are removed, for instance, by laser-ablation, to exposed multiple layers of conductive traces of the tamper-respondent sensor. In particular, FIG. 9B depicts an exposed region 810 with multiple transverse conductive traces 811 in different layers of the tamper-respondent sensor, as well as an unexposed region 812, with exposed region 810 and unexposed region 812 assumed to be located over an edge surface of the enclosure that is to bond to a circuit board at an enclosure-to-board interface, as described herein. Note in one embodiment, that laser-ablation techniques can be used to selectively remove multiple layers of the tamper-respondent sensor and obtain a structure similar to that illustrated, as described further below. Note also that with laser-ablation, the flexible layer, i.e., dielectric layer, between the different layers of conductive traces remains in place where one conductive trace layer overlies the other. With a configuration such as depicted in FIG. 9B, the adhesive at the enclosure-to-board interface directly contacts the multiple layers of conductive traces in the exposed regions of the tamper-respondent sensor over the edge surface of the enclosure, thereby ensuring greater bonding of the adhesive to the exposed traces, and again increasing susceptibility of the tamper-respondent sensor to detection of a taper event at the enclosure-to-board interface by increasing likelihood of disruption of the conductive traces responsive to the tamper event.

Figure 10A:
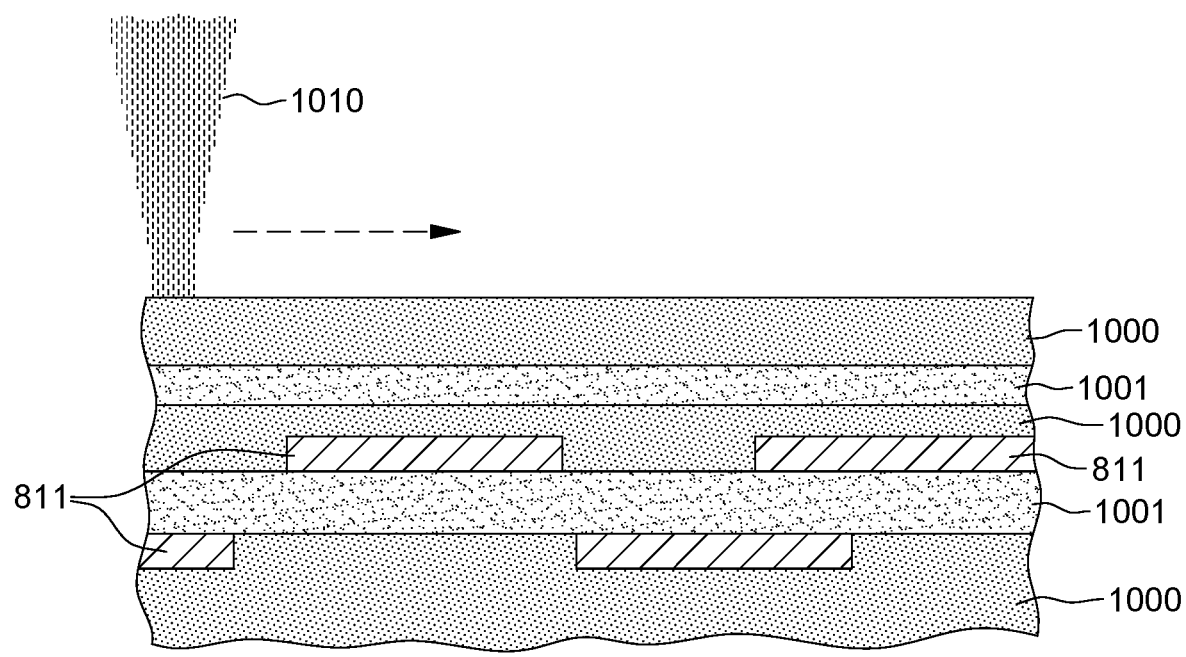
FIG. 10A is a partial cross-sectional elevational view of one embodiment of a tamper-respondent sensor of an enclosure assembly to have partially exposed conductive traces at an edge surface of the enclosure to mount to a circuit board, in accordance with one or more aspects of the present invention.
Figure 10B:
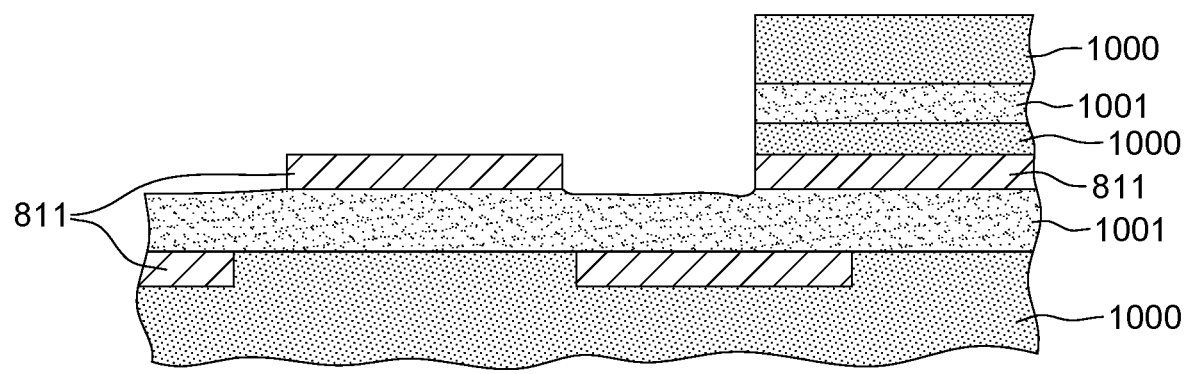
FIG. 10B depicts the tamper-respondent sensor of FIG. 10A after removal of one or more layers of the tamper-respondent sensor to establish one or more exposed regions and one or more unexposed regions of the at least one conductive trace, in accordance with one or more aspects of the present invention.
Figure 10C:
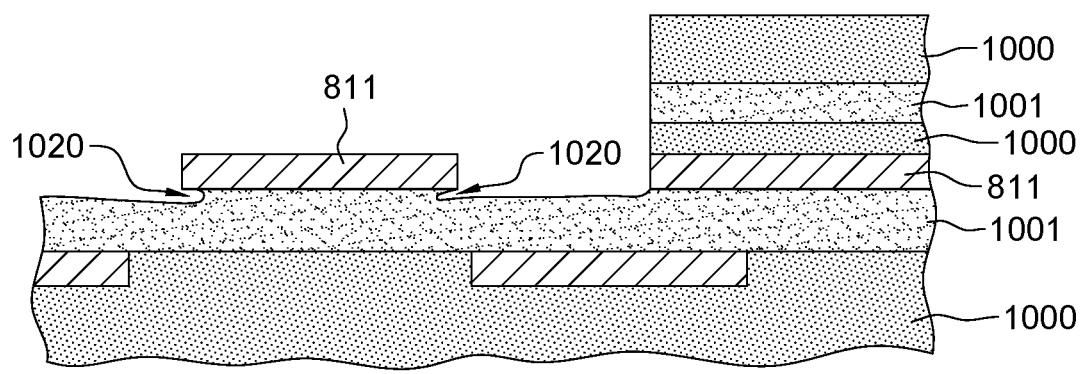
FIG. 10C depicts a further variation on the tamper-respondent sensor of FIGS. 10A & 10B, where an exposed conductive trace of the tamper-respondent sensor is further partially undercut to increase susceptibility to breaking with a tamper event, in accordance with one or more aspects of the present invention.

FIGS. 10A-10C depict an approach for selectively removing one or more layers of a tamper-respondent sensor to provide exposed regions and unexposed regions of the conductive trace(s), as described herein.

In one embodiment, one or more layers of the tamper-respondent sensor, such as one or more outer layers (e.g., layers formed of polyimide or Kapton, can be removed by laser-ablation without damaging the conductive traces, by appropriately selecting laser wavelength and pulse width. For instance, both copper and gold conductive trace materials are highly reflective at wavelengths greater than 650 nm. Thus, in one or more embodiments, a laser wavelength of 1030 nm can be chosen, assuming the conductive traces are formed of copper and/or gold. Ultra-fast lasers are able to ablate (or remove) material without substantial material heating and collateral damage or melting. A 300 Femto second (Fsec) laser cleanly ablates flexible layers, such as polyimide layers, without damaging the conductive traces. A high-speed optical scanner can be used to scan a laser spot 1010 across a tamper-respondent sensor, or flex circuit, as illustrated in FIG. 10A. A wide variety of scan patterns, scan angles and ablated shapes are possible using this approach.

Referring to FIG. 10A, in one embodiment, the tamper-respondent sensor can include multiple layers, including multiple polyimide layers 1000, and adhesive layers 1001, along with multiple layers of conductive traces 811, as illustrated. In one specific example, the high-speed optical scanner 1010, in addition to having a desired wavelength, can have a pulse width of, for instance, 300 Fsec, and a repetition rate of 1 MHz, with, for instance, a 20 μm laser spot, and be scanned at 5 meters/second, with 10 micro-inch/line spacing, and used with one or more scan passes to control ablation depth to the desired level.

FIG. 10B depicts the resultant structure, with an exposed region, where a conductive trace 811 is exposed, and an unexposed region, where a conductive trace 811 remains unexposed.

As noted, a wide variety of scan patterns, scan angles and ablated shapes are possible. In FIG. 10C, an angled laser-ablation process has been used to undercut, in part, support for the exposed conductive trace 811, if desired, to further increase susceptibility of the tamper-respondent sensor to a tamper event at the enclosure-to-board bond interface by increasing likelihood of disrupting the conductive trace 811 with the tamper event. The laser-ablation in operation reduces the cross-sectional strength of the tamper-respondent sensor in the region of the exposed conductive trace.

Those skilled in the art will note from the description provided herein that many variations are possible, depending on the desired degree of susceptibility to breaking of the conductive trace(s) with a tamper event at the enclosure-to-board bond interface.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tamper-respondent assembly comprising:
a circuit board;
an enclosure assembly mounted to the circuit board and enclosing at least one electronic component coupled to the circuit board within a secure volume, the enclosure assembly comprising:
an enclosure with an edge surface coupled to the circuit board along an enclosure-to-board interface;
a tamper-respondent sensor, the tamper-respondent sensor covering, at least in part, an inner surface of the enclosure and extending over the edge surface of the enclosure at the enclosure-to-board interface, between the enclosure and the circuit board, the tamper-respondent sensor being secured at the enclosure-to-board interface to the circuit board via an adhesive, and the tamper-respondent sensor comprising:
multiple layers;
at least one tamper-detect circuit, the at least one tamper-detect circuit comprising at least one conductive trace in a tamper-detect pattern covered, at least in part, by at least one layer of the multiple layers; and
wherein the at least one layer of the multiple layers is at least partially removed to provide exposed regions and unexposed regions of the at least one conductive trace at the enclosure-to-board interface, the at least one conductive trace being contacted in the exposed regions by the adhesive securing the tamper-respondent sensor to the circuit board at the enclosure-to-board interface; and
a monitor circuit to monitor the at least one tamper-detect circuit of the tamper-respondent sensor for a tamper event.

2. The tamper-respondent assembly of claim 1, wherein the tamper-respondent sensor is flexible, and the at least one layer of the multiple layers comprises at least one flexible layer.

3. The tamper-respondent assembly of claim 2, wherein the at least one layer of the multiple layers comprises an outer layer of the tamper-respondent sensor.

4. The tamper-respondent assembly of claim 1, wherein the exposed regions and the unexposed regions alternate over the edge surface of the enclosure along the enclosure-to-board interface.

5. The tamper-respondent assembly of claim 1, wherein the exposed regions of the at least one conductive trace cover a larger surface area over the edge surface of the enclosure than the unexposed regions of the at least one conductive trace.

6. The tamper-respondent assembly of claim 1, wherein the exposed regions and the unexposed regions alternate in multiple different patterns over the edge surface of the enclosure along the enclosure-to-board interface.

7. The tamper-respondent assembly of claim 1, wherein the at least one layer of the multiple layers is removed to different depths over the edge surface of the enclosure at the enclosure-to-board interface, with at least two exposed regions of the exposed regions having different depths of exposure into the tamper-respondent sensor at the enclosure-to-board interface.

8. The tamper-respondent assembly of claim 1, wherein the at least one conductive trace comprises conductive traces on at least two layers of the multiple layers, and wherein the at least one layer of the multiple layers is partially removed to partially expose within the exposed regions the conductive traces on the at least two layers of the multiple layers for contact by the adhesive securing the tamper-respondent sensor to the circuit board within the enclosure-to-board interface.

9. The tamper-respondent assembly of claim 1, wherein the unexposed regions are configured as peninsulas of unexposed regions extending only partially across a width of the enclosure-to-board interface.

10. The tamper-respondent assembly of claim 1, wherein support for the at least one conductive trace is undercut, in part, within the exposed regions of the tamper-respondent sensor over the edge surface of the enclosure to increase susceptibility of the at least one conductive trace to breaking with the tamper event.

11. A tamper-respondent assembly comprising:
a multilayer circuit board, wherein the multilayer circuit board includes an embedded tamper-detect circuit embedded at least in part, within the multilayer circuit board;
an enclosure assembly mounted to the circuit board and enclosing at least one electronic component coupled to the circuit board within a secure volume, the enclosure assembly comprising:
an enclosure with an edge surface coupled to the circuit board along an enclosure-to-board interface;
a tamper-respondent sensor, the tamper-respondent sensor covering, at least in part, an inner surface of the enclosure and extending over the edge surface of the enclosure within the enclosure-to-board interface, between the enclosure and the circuit board, the tamper-respondent sensor being secured at the enclosure-to-board interface to the circuit board via an adhesive, and the tamper-respondent sensor comprising:
multiple layers;
at least one tamper-detect circuit, the at least one tamper-detect circuit comprising at least one conductive trace in a tamper-detect pattern covered, at least in part, by at least one layer of the multiple layers; and
wherein the at least one layer of the multiple layers is at least partially removed to provide exposed regions and unexposed regions of the at least one conductive trace at the enclosure-to-board interface, the at least one conductive trace being contacted in the exposed regions by the adhesive securing the tamper-respondent sensor to the circuit board within the enclosure-to-board interface; and a monitor circuit to monitor the at least one tamper-detect circuit of the tamper-respondent sensor for a tamper event.

12. The tamper-respondent assembly of claim 11, wherein the tamper-respondent sensor is flexible, and the at least one layer of the multiple layer comprises at least one flexible layer, and wherein the exposed regions of the at last one conductive trace cover a larger surface area over the edge surface of the enclosure than the unexposed regions of the at least one conductive trace.

13. The tamper-respondent assembly of claim 11, wherein the at least one layer of the multiple layers is removed to different depths over the edge surface of the enclosure at the enclosure-to-board interface, with at least two exposed regions of the exposed regions having different depths of exposure into the tamper-respondent sensor at the enclosure-to-board interface.

14. The tamper-respondent assembly of claim 11, wherein the at least one conductive trace comprises conductive traces on at least two layers of the multiple layers, and wherein the at least one layer of the multiple layers is partially removed to partially expose within the exposed regions the conductive traces on the at least two layers of the multiple layers for contact by the adhesive securing the tamper-respondent sensor to the circuit board within the enclosure-to-board interface.

15. The tamper-respondent assembly of claim 11, wherein the unexposed regions are configured as peninsulas of unexposed regions extending only partially across a width of the enclosure-to-board interface.

16. A fabrication method comprising:
fabricating a tamper-respondent assembly, the fabricating comprising:
providing an enclosure assembly to mount to a circuit board to enclose at least one electronic component coupled to the circuit board within a secure volume, the enclosure assembly including:
an enclosure with an edge surface to couple to the circuit board along an enclosure-to-board interface;
a tamper-respondent sensor, the tamper-respondent sensor covering, at least in part, an inner surface of the enclosure and extending over the edge surface of the enclosure, the tamper-respondent sensor comprising:
multiple layers; and
at least one tamper-detect circuit, the at least one tamper-detect circuit comprising at least one conductive trace in a tamper-detect pattern covered, at least in part, by at least one layer of the multiple layers; and selectively removing the at least one layer of the multiple layers of the tamper-respondent sensor covering the at least one conductive trace at the edge surface of the enclosure to provide exposed regions and unexposed regions of the at least one conductive trace over the edge surface of the enclosure;

adhesively securing the enclosure assembly to the circuit board using an adhesive within the enclosure-to-board interface, the adhesive contacting the at least one conductive trace within the exposed regions of the tamper-respondent sensor; and providing a monitor circuit to monitor the at least one tamper-detect circuit of the tamper-respondent sensor for a tamper event.

17. The fabrication method of claim 16, wherein the selectively removing uses laser-ablation to selectively remove the at least one layer of the multiple layers of the tamper-respondent sensor covering the at least one conductive trace over the edge surface of the enclosure, the laser-ablation removing the at least one layer of the multiple layers without damaging the at least one conductive trace of the tamper-respondent sensor.

18. The fabrication method of claim 17, wherein the laser-ablation selectively removes the at least one layer of the multiple layers of the tamper-respondent sensor covering the at least one conductive trace over the edge surface of the enclosure to different depths, where at least two exposed regions of the exposed regions have different depths of exposure into the tamper-respondent sensor.

19. The fabrication method of claim 16, wherein the at least one conductive trace comprises conductive traces on at least two layers of the multiple layers, and wherein the selectively removing comprises using laser-ablation to selectively remove the at least one layer of the multiple layers and partially expose within the exposed regions the conductive traces on the at least two layers of the multiple layers for contact by the adhesive securing the enclosure assembly to the circuit board.

20. The fabrication method of claim 16, wherein the selectively removing further comprises undercutting, in part, support for the at least one conductive trace within the exposed regions of the tamper-respondent sensor over the edge surface of the enclosure, to increase susceptibility of the at least one conductive trace to breaking with the tamper event.

* * * * *